United States Patent
Lee

(10) Patent No.: US 9,332,656 B2
(45) Date of Patent: May 3, 2016

(54) INTERPOSER AND METHOD FOR MANUFACTURING SAME

(71) Applicant: Zhen Ding Technology Co., Ltd., Tayuan, Taoyuan (TW)

(72) Inventor: Taekoo Lee, Qinhuangdao (CN)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 162 days.

(21) Appl. No.: 14/150,723

(22) Filed: Jan. 8, 2014

(65) Prior Publication Data

US 2015/0136457 A1    May 21, 2015

(30) Foreign Application Priority Data

Nov. 20, 2013    (CN) .......................... 2013 1 05846534

(51) Int. Cl.
*H01L 29/40*    (2006.01)
*H05K 3/42*    (2006.01)
*H05K 1/03*    (2006.01)
*H05K 3/00*    (2006.01)

(52) U.S. Cl.
CPC ............. *H05K 3/423* (2013.01); *H05K 1/0306* (2013.01); *H05K 3/007* (2013.01); *H05K 3/421* (2013.01); *H05K 3/427* (2013.01); *Y10T 29/49165* (2015.01)

(58) Field of Classification Search
CPC ................... H01L 21/02063; H01L 21/76877; H01L 23/5384
See application file for complete search history.

(56) References Cited

U.S. PATENT DOCUMENTS 6,249,045 B1 *    6/2001    Kresge et al. ................. 257/678

* cited by examiner

*Primary Examiner* — Elias M Ullah
(74) *Attorney, Agent, or Firm* — Novak Druce Connolly Bove + Quigg LLP

(57) ABSTRACT

An interposer includes an insulating substrate, a photosensitive dielectric film, a conductive layer, and a conductive via. The insulating substrate includes a bottom surface and a top surface, and defines a receiving through hole extending through the bottom surface and the top surface. The photosensitive dielectric film is mounted on the bottom surface. The photosensitive dielectric film defines a through hole spatially corresponding to and communicating with the receiving through hole. The conductive layer is mounted on an end of the photosensitive dielectric film away from the insulating substrate. The conductive layer covers an end of the through hole. The conductive via is received in the receiving through hole and the through hole. The conductive via contacts and electrically connects to the conductive layer.

4 Claims, 7 Drawing Sheets providing an assembling plate, the assembling plate comprising a supporting sheet, an adhesive film laminated on the supporting sheet, a metallic conductive layer laminated on the adhesive film, and a photosensitive dielectric film laminated on the metallic conductive layer

providing an insulative layer, the insulative layer defining a receiving through hole

assembling the insulative layer onto the photosensitive dielectric film, the photosensitive dielectric film covering an end portion of the receiving through hole

irradiating the photosensitive dielectric film to expose the photosensitive dielectric film by using light, so as to define a through hole in the photosensitive dielectric film, the through hole communicating with the receiving through hole

forming a conductive element on the metallic conductive layer in the receiving through hole and the through hole, the conductive element electrically connected to the metallic conductive layer

removing the adhesive film and the supporting sheet, so as to obtain the interposer plate

FIG. 2

INTERPOSER AND METHOD FOR MANUFACTURING SAME

BACKGROUND

1. Technical Field

The present disclosure relates to an interposer and a method for manufacturing the interposer.

2. Description of Related Art

Manufacturing processes of interposers includes forming a seed layer in a receiving through hole of an insulating substrate. However, the process is complex and time-consuming. Furthermore, the seed layer generates thermal stress on the interposer.

Therefore, what is needed is an interposer and a method for manufacturing the interposer that can overcome the above-mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

FIG. 2 is a flowchart of an embodiment of a method for manufacturing the interposer of FIG. 1.

DETAILED DESCRIPTION

Figure 1:
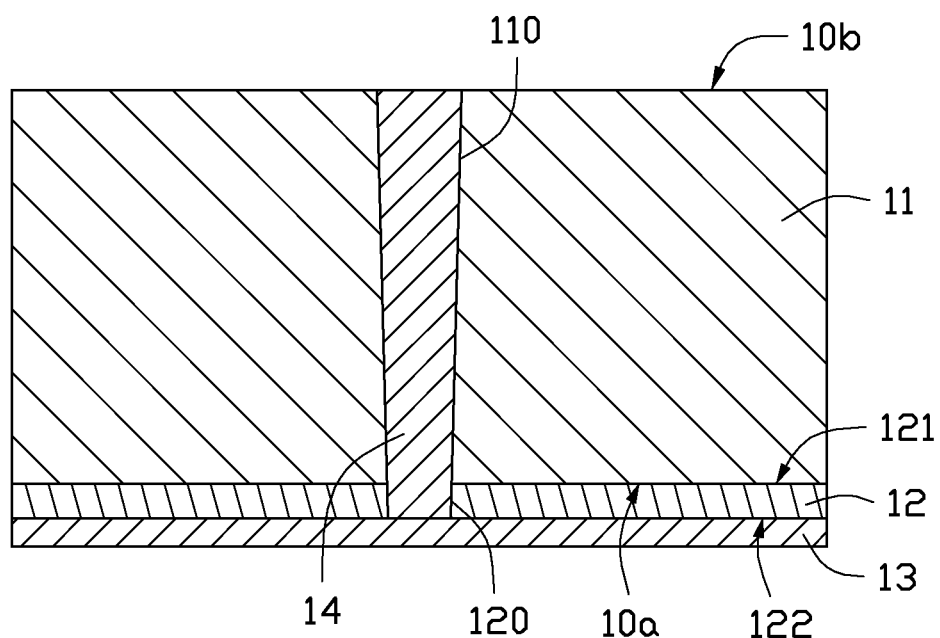
FIG. 1 is a schematic, cross-sectional view of an embodiment of an interposer.

FIG. 1 shows an embodiment of an interpose plate 10. The interpose plate 10 includes an insulating substrate 11, a photosensitive dielectric film 12, a conductive layer 13, and a conductive via 14.

The insulating substrate 11 includes a bottom surface 10a and a top surface 10b. The bottom surface 10a is substantially parallel to the top surface 10b. In one embodiment, the insulating substrate 11 is made of glass. The insulating substrate 11 defines a receiving through hole 110 extending through the bottom surface 10a and the top surface 10b.

The photosensitive dielectric film 12 is mounted on the bottom surface 10a. In one embodiment, the photosensitive dielectric film 12 is made of photosensitive polyimides. The photosensitive dielectric film 12 includes a supporting surface 121 contacting the bottom surface 10a and a lower surface 122 facing away from the bottom surface 10a. The photosensitive dielectric film 12 defines a through hole 120 spatially corresponding to and communicating with the receiving through hole 110.

The conductive layer 13 is mounted on the lower surface 122 of the photosensitive dielectric film 12, and covers an end of the through hole 120. The conductive layer 13 can be made of, but is not limited to, copper, silver, or gold.

In one embodiment, the conductive via 14 is an electroplated copper layer formed in the receiving through hole 110 and the through hole 120 by an electroplating method. The conductive via 14 contacts and electrically connects to the conductive layer 13.

Unlike conventional interposers, the interposer 100 omits a seed layer in the receiving through hole 110. Therefore, the conductive via 14 is formed directly in the receiving through hole 110 without the seed layer, which prevents generation of thermo-mechanical stress between copper and sidewall of the through hole 110. Consequently, reliability can be improved.

FIG. 2 is a flowchart of a method for manufacturing the interposer 100. The method is as follows and illustrated in FIGS. 3-7.

Figure 3:
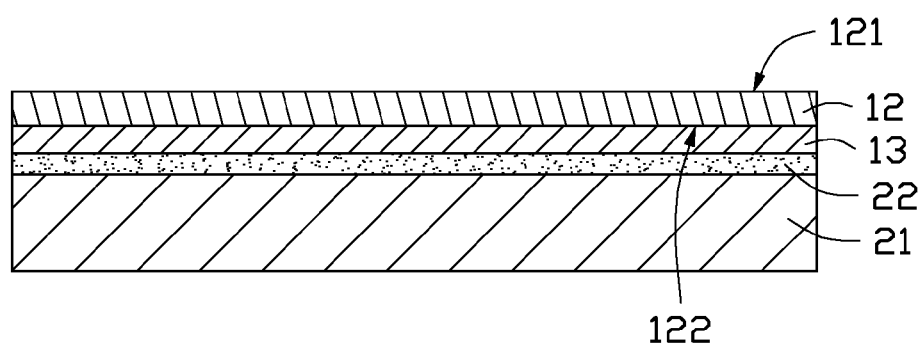
FIGS. 3-7 are views showing successive stages of the method for manufacturing the interposer of FIG. 1.

FIG. 3 shows that in step 1, an assembling plate 20 is provided. The assembling plate 20 includes a supporting sheet 21, an adhesive film 22 laminated on the supporting sheet 21, a conductive layer 13 laminated on the adhesive film 22, and a photosensitive dielectric film 12 laminated on the conductive layer 13. The photosensitive dielectric film 12 includes a lower surface 122 contacting the conductive layer 13 and a supporting surface 121.

Figure 4:
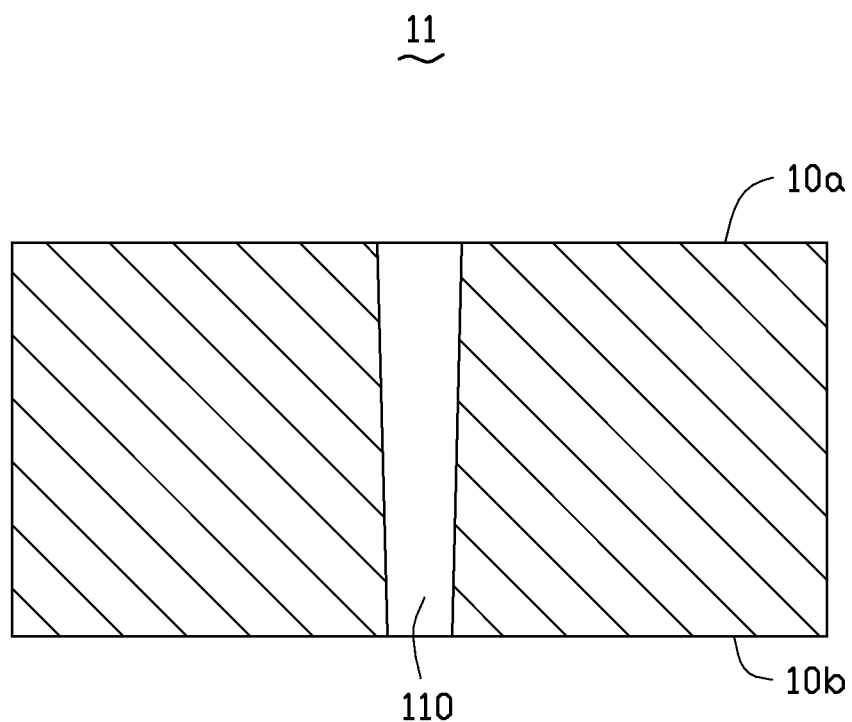

FIG. 4 shows that in step 2, an insulative layer 11 is provided. The insulative layer 11 includes a bottom surface 10a and a top surface 10b. A receiving through hole 110 is defined in the insulative layer 11 by an electric laser ablation method.

Figure 5:
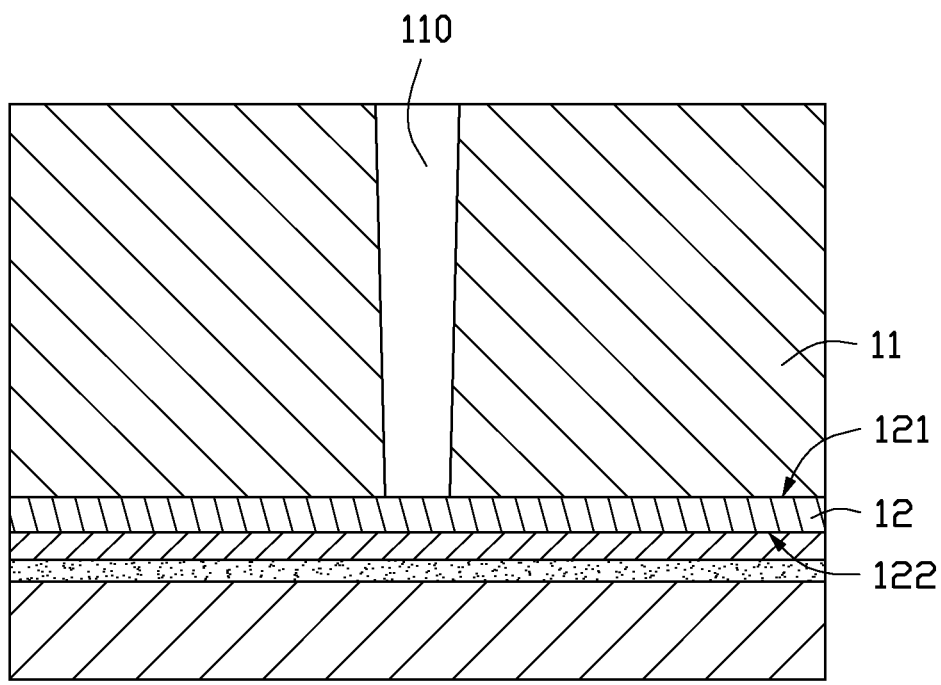

FIG. 5 shows that in step 3, the insulative layer 11 is assembled onto the supporting surface 121, such that the supporting surface 121 covers one end of the receiving through hole 110.

Figure 6:
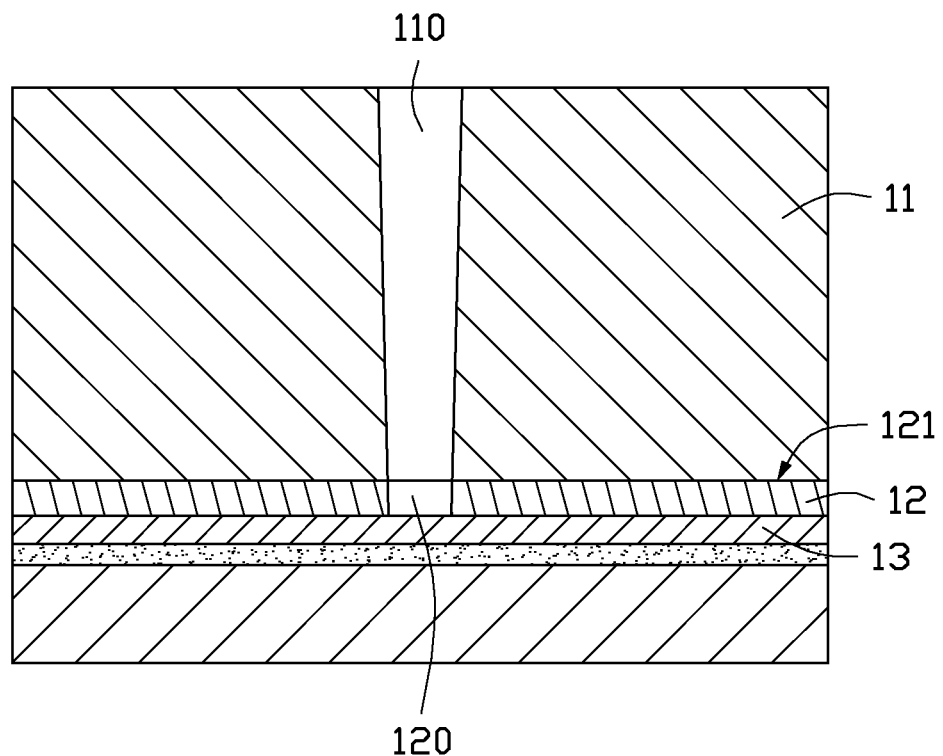

FIG. 6 shows that in step 4, light is irradiated onto the supporting surface 121 of the photosensitive dielectric film 12 to expose the photosensitive dielectric film 12 and define a through hole 120 in the dielectric film 12. The through hole 120 communicates with the receiving through hole 110. In one embodiment, the light is ultraviolet light.

Figure 7:
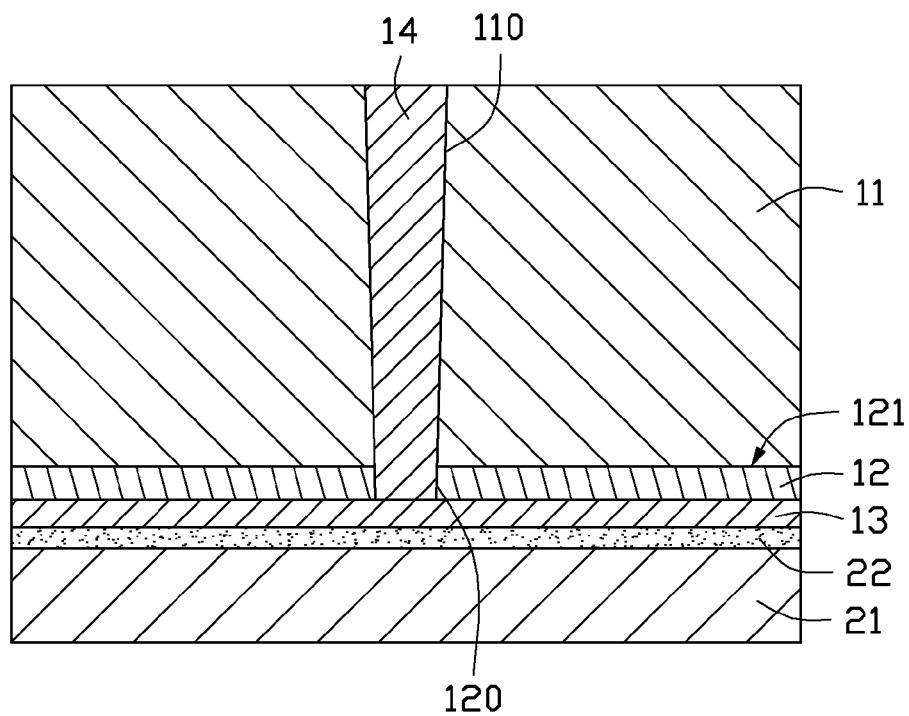

FIG. 7 shows that in step 5, a conductive via 14 is formed on the conductive layer 13 by an electroplating method. The conductive via 14 is further formed in the receiving through hole 110 and the through hole 120 and electrically connected to the conductive layer 13.

Finally, the adhesive film 22 and the supporting sheet 21 are removed to obtain the interposer 10.

Unlike conventional method, using the photosensitive dielectric film 12 with the conductive layer 13, the adhesive film 22 and the supporting sheet 21, the process becomes simple, for example, sputtering for seed layer can be removed. Therefore, process cost reduction might be achieved.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. An interposer, comprising:
   an insulating substrate comprising a bottom surface and a top surface, and defining a receiving through hole extending through the bottom surface and the top surface;
   a photosensitive dielectric film mounted on the bottom surface, the photosensitive dielectric film defining a through hole spatially corresponding to and communicating with the receiving through hole;
   a conductive layer mounted on an end of the photosensitive dielectric film away from the insulating substrate, the conductive layer covering an end of the through hole; and
   a conductive via received in the receiving through hole and the through hole, the conductive via contacting and electrically connecting to the conductive layer.

2. The interposer of claim 1, wherein the insulating substrate is made of a glass.

3. The interposer of claim 1, wherein the photosensitive dielectric film comprises a supporting surface contacting the bottom surface and a lower surface, the through hole penetrating through the supporting surface and the bottom surface.

4. The interposer of claim 1, wherein the conductive via is an electroplated copper layer.

* * * * *